(12) United States Patent
Cho et al.

(10) Patent No.: US 11,744,128 B2
(45) Date of Patent: *Aug. 29, 2023

(54) DISPLAY APPARATUS

(71) Applicant: Samsung Display Co., Ltd., Yongin-si (KR)

(72) Inventors: Youngjin Cho, Seoul (KR); Joong-Soo Moon, Hwaseong-si (KR); Cheol-Gon Lee, Suwon-si (KR); Yang Wan Kim, Hwaseong-si (KR); Changkyu Jin, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 98 days.

This patent is subject to a terminal disclaimer.

(21) Appl. No.: 17/307,188

(22) Filed: May 4, 2021

(65) Prior Publication Data

US 2021/0257441 A1 Aug. 19, 2021

Related U.S. Application Data

(63) Continuation of application No. 16/380,915, filed on Apr. 10, 2019, now Pat. No. 11,004,927.

(30) Foreign Application Priority Data

Jun. 29, 2018 (KR) ........................ 10-2018-0075920

(51) Int. Cl.
*H10K 59/131* (2023.01)
*H10K 50/844* (2023.01)
(Continued)

(52) U.S. Cl.
CPC ..... *H10K 59/1315* (2023.02); *H10K 50/8445* (2023.02); *H10K 59/122* (2023.02); *H10K 59/1213* (2023.02)

(58) Field of Classification Search
CPC . H01L 51/50–56; H01L 51/0032–0095; H01L 27/32–3297; H01L 2225/15–568;
(Continued)

(56) References Cited

U.S. PATENT DOCUMENTS 9,153,631 B2 10/2015 Sung et al.
9,412,972 B2 8/2016 Shim et al.
(Continued)

FOREIGN PATENT DOCUMENTS

KR 10-2015-0001012 1/2015
KR 10-2015-0094950 8/2015
(Continued)

OTHER PUBLICATIONS

Non-Final Office Action dated Jun. 2, 2020, in U.S. Appl. No. 16/380,915.
(Continued)

*Primary Examiner* — Tucker J Wright
(74) *Attorney, Agent, or Firm* — H.C. Park & Associates, PLC

(57) ABSTRACT

A display apparatus including a substrate, a first power source line disposed in a peripheral area adjacent to a display area, the first power source line including a first layer and a second layer electrically connected to each other, a first gate pattern disposed between the first layer of the substrate and including a first gate fan-out line in the peripheral area and a first gate connecting line connected to the first gate fan-out line and extending between the first gate fan-out line and the display area, a first insulation layer disposed between the first layer and the second layer of the first power source line, a second insulation layer disposed between the first insulation layer and the second layer, and a first insulating dam
(Continued)

disposed on and contacting the second layer, the first insulating dam disposed in the peripheral area and surrounding the display area.

20 Claims, 12 Drawing Sheets

(51) Int. Cl.
*H10K 59/122* (2023.01)
*H10K 59/121* (2023.01)

(58) Field of Classification Search
CPC .......... B32B 2457/206; H10K 50/8445; H10K 59/122; H10K 59/1213; H10K 59/1315
See application file for complete search history.

(56) References Cited

U.S. PATENT DOCUMENTS

| | | | |
|---|---|---|---|
| 9,859,334 B2 | 1/2018 | Kim et al. | |
| 9,941,484 B2 | 4/2018 | Kim | |
| 10,050,100 B2 | 8/2018 | Lee et al. | |
| 11,004,927 B2 * | 5/2021 | Cho | H01L 51/5246 |
| 11,063,238 B2 | 7/2021 | Lee et al. | |
| 11,476,297 B2 | 10/2022 | Lee et al. | |
| 2015/0228927 A1 | 8/2015 | Kim | |
| 2016/0285038 A1 | 9/2016 | Kim | |
| 2017/0294501 A1 | 10/2017 | Jang et al. | |

FOREIGN PATENT DOCUMENTS

| | | |
|---|---|---|
| KR | 10-2016-0032800 | 3/2016 |
| KR | 10-2017-0090382 | 8/2017 |
| KR | 10-2017-0126556 | 11/2017 |
| KR | 10-2017-0134903 | 12/2017 |
| KR | 10-2018-0036907 | 4/2018 |
| KR | 10-2018-0064601 | 6/2018 |

OTHER PUBLICATIONS

Final Office Action dated Sep. 25, 2020, in U.S. Appl. No. 16/380,915.
Advisory Action dated Nov. 24, 2020, in U.S. Appl. No. 16/380,915.
Notice of Allowance dated Jan. 8, 2021, in U.S. Appl. No. 16/380,915.
Korean Office Action dated Nov. 22, 2022, in Korean Patent Application No. 10-2018-0075920 (with English Translation).

* cited by examiner

DISPLAY APPARATUS

CROSS REFERENCE TO RELATED APPLICATIONS

This application is a Continuation of U.S. patent application Ser. No. 16/380,915, filed Apr. 10, 2019, which claims priority from and the benefit of Korean Patent Application No. 10-2018-0075920, filed on Jun. 29, 2018, each of which is hereby incorporated by reference for all purposes as if fully set forth herein.

BACKGROUND

Field

Exemplary embodiments of the invention relate generally to a display apparatus, and more specifically, to a display apparatus having an insulating dam formed in a non-display area.

Discussion of the Background

A cathode ray tube (CRT) display apparatus has been widely used due to its performance and competitive price. However, a CRT display apparatus has a weakness in terms of size and portability. As such, a display apparatus having light weight and small size has been developed and quickly replacing the CRT display apparatus. More particularly, a display apparatus, such as a plasma display apparatus, a liquid crystal display apparatus, and an organic light emitting display apparatus, has been highly regarded due to its smaller size, lighter weight, and lower power consumption over a CRT display apparatus.

Generally, a display apparatus includes a display area to display an image and a peripheral non-display area surrounding the display area. During manufacture, an insulating dam may formed in the peripheral area of the display apparatus due to a process necessity or the like. In addition, a display apparatus may include a plurality of wirings in the peripheral area in order to provide a signal and a voltage necessary for driving the display apparatus. However, external light may be reflected by the wirings, which may deteriorate visibility of the display apparatus.

The above information disclosed in this Background section is only for understanding of the background of the inventive concepts, and, therefore, it may contain information that does not constitute prior art.

SUMMARY

A display device constructed according to exemplary embodiments of the invention includes an insulating dam having a rigid structure and is capable of suppressing deterioration of the visibility from wirings in a peripheral area.

Additional features of the inventive concepts will be set forth in the description which follows, and in part will be apparent from the description, or may be learned by practice of the inventive concepts.

A display apparatus according to an exemplary embodiment includes a substrate, a first power source line disposed in a peripheral area adjacent to a display area configured to display image, the first power source line including a first layer and a second layer disposed on the first layer and electrically connected to the first layer, a first insulation layer disposed between the first layer and the second layer of the first power source line, and a first insulating dam disposed on and contacting the second layer of the first power source line, the first insulating dam disposed in the peripheral area and surrounding the display area.

The first insulation layer may have an opening overlapping the first insulating dam, and the first layer and the second layer of the first power source line may contact each other in the opening of the first insulation layer.

The display apparatus may further include a first gate pattern disposed between the substrate and the first layer of the first power source line, a first gate insulation layer disposed between the first gate pattern and the first layer of the first power source line, and a second insulation layer disposed between the first layer and the second layer of the first power source line.

The first insulation layer may include inorganic insulation material, and the second insulation layer may include organic insulation material.

The first gate pattern may include a first gate fan-out line disposed in the peripheral area, and a first gate connecting line connected to the first gate fan-out line and extending between the first gate fan-out line and the display area, and the first and second insulation layers may be opened on the first gate connecting line such that the first layer of the first power source line may contact the second layer of the first power source line.

The display apparatus may further include a second gate pattern disposed between the first gate pattern and the first layer of the first power source line, and a second gate insulation layer disposed between the first gate pattern and the second gate pattern, in which the second gate pattern may include a second gate fan-out line disposed in the peripheral area, and a second gate connecting line disposed between the second gate fan-out line and the display area, and connected to the second gate fan-out line, and a gap between the first gate fan-out line and the second gate fan-out line may be less than a gap between the first gate connecting line and the second gate connecting line in a plan view.

The second insulation layer may be disposed between the first and second layers of the first power source line on the first and second gate fan-out lines, and an upper surface of the second layer of the first power source line may be substantially flat.

The display apparatus may further include a second insulating dam disposed on the first insulation layer in the peripheral area, spaced apart from the first insulating dam, surrounding the first insulating dam, and having a height greater than that of the first insulating dam.

The display apparatus may further include a third insulating dam disposed on the first insulation layer in the peripheral area, spaced apart from the second insulating dam, surrounding the second insulating dam, and having a height greater than that of the second insulating dam.

The display apparatus may further include a first power supplying line disposed in the display area and including a first layer electrically connected to the first layer of the first power source line, and a second layer electrically connected to the first layer of the first power source line, a second insulation layer disposed between the first and second layers of the first power supplying line, a third insulation layer disposed on the second layer of the first power supplying line and the second insulation layer, and a pixel defining layer disposed on the third insulation layer, in which the first insulating dam and the pixel defining layer may include the same material.

The second insulating dam may include a first portion including the same material as the second insulation layer or the third insulation layer, and a second portion including the same material as the pixel defining layer.

The third insulating dam may include a first portion including the same material as the second insulation layer, a second portion disposed on the first portion of the third insulating dam and including the same material as the third insulation layer, and a third portion disposed on the second portion of the third insulating dam and including the same material as the pixel defining layer.

The second layer of the first power source line may include an extended portion protruding along the first insulating dam in a plan view.

The display apparatus may further include a second power source line disposed in the peripheral area, the second power source line may include a first layer disposed between the substrate and the first insulation layer, and a second layer disposed between the first layer of the second power source line and the first insulation layer and electrically connected to the first layer of the second power source line, in which a distance between the extended portion of the second layer of the first power source line and the second layer of the second power source line may be less than a distance between a portion of the second layer of the first power source line where the extended portion is not formed and the second layer of the second power source line in a plan view.

The display apparatus may further include a first inorganic layer disposed on the substrate and covering the second layer of the first power source line and the first insulating dam, an organic layer disposed on the first inorganic layer and not overlapping an upper surface of the first insulating dam, and a second inorganic layer disposed on the organic layer and the first inorganic layer.

A display apparatus according to another exemplary embodiment includes a substrate, a first gate pattern disposed in a peripheral area adjacent to a display area configured to display an image, a first gate insulation layer disposed on the first gate pattern, a first power source line including a first layer disposed on the first gate insulation layer in the peripheral area and a second layer disposed on the first layer and electrically connected to the first layer, a first insulation layer disposed between the first and second layers of the first power source line, a second insulation layer disposed between the first insulation layer and the second layer of the first power source line, the second insulation layer including organic insulation material, and a first insulating dam disposed in the peripheral area and surrounding the display area.

The first insulation layer may have an opening, the first and second layers of the first power source may contact each other in the opening, and the first insulating dam may contact the second layer of the first power source line.

The display apparatus may further include a plurality of gate fan-out lines disposed between the second insulation layer and the substrate, the gate fan-out lines extending along a direction from the peripheral area to the display area, in which the second insulation layer may be disposed between the first and second layers of the first power source line, and includes organic insulation material.

The first layer of the first power source line, the second layer of the first power source line, and the first insulating dam may be sequentially stacked to contact each other.

A display apparatus according to yet another exemplary embodiment includes a substrate, a first power source line including a first layer and a second layer, a first insulation layer disposed between the first and second layers of the first power source line and including inorganic insulation material, a first insulating dam disposed on and contacting the second layer of the first power source line, in which the first insulation layer has an opening overlapping the first insulating dam in a plan view, and the first and second layers of the first power source line contact each other in the opening.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
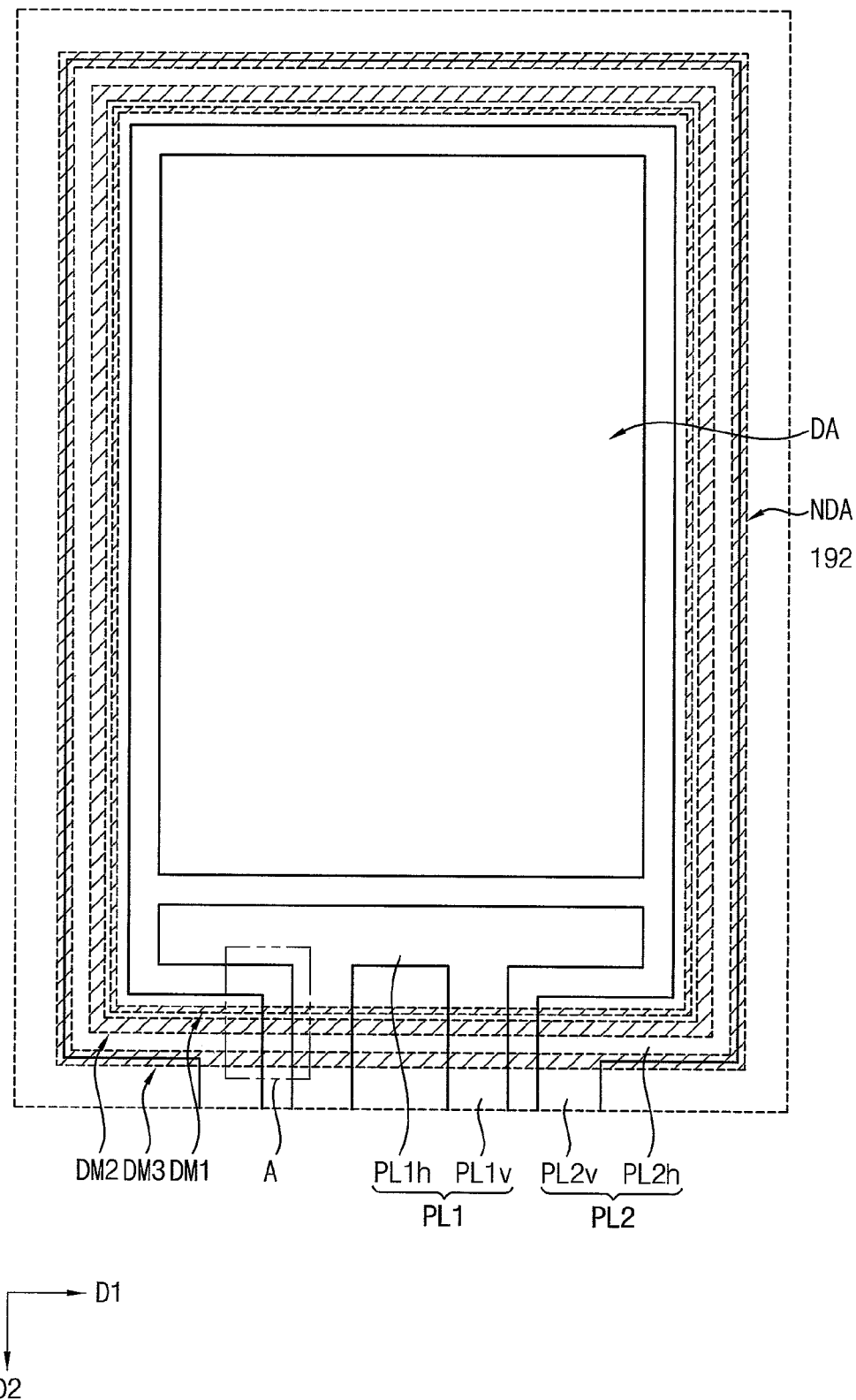
FIG. 1 is a plan view illustrating a display apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, the inventive concepts will be explained in detail with reference to the accompanying drawings.

FIG. 1 is a plan view illustrating a display apparatus according to an exemplary embodiment.

Referring to FIG. 1, the display apparatus may include a display area DA, and a peripheral area NDA, which is a non-display area that surrounds the display area DA.

The display apparatus may include a plurality of pixels disposed in the display area DA. The display apparatus may further include a driving part for driving the pixels and a power supplying part for providing power to the pixels, which are disposed in the peripheral area NDA. The display apparatus may further include wiring part connecting the driving part to the pixels.

Each of the pixels may be a minimum unit for displaying an image. The pixels may include a display element, which may emit color light. For example, the display apparatus may be a liquid crystal display (LCD) device, an electrophoretic display device (EPD device), an electrowetting display device (EWD device), or an organic light emitting display device (OLED device). Hereinafter, the display apparatus will be described with reference to an organic light emitting display apparatus, but the inventive concepts are not limited thereto.

Each of the pixels may emit one of red, green, and blue colors, without being limited thereto. For example, each of the pixels may emit colors, such as cyan, magenta, yellow, and white. The pixels will be described later in more detail with reference to FIGS. 2 and 3.

The power supplying part may include at least one of the power source lines ELVDD and EDVSS. For example, the power supplying part may include a first power source line PL1 and a second power source line PL2. The first power source line PL1 and the second power source line PL2 may provide power to the pixels. The first power source line PL1 may provide a first power source ELVDD to the pixels, and the second power source line PL2 may provide a second power source ELVSS to the pixels.

The first power source line PL1 may include a first portion PL1$h$ extending substantially in a first direction D1, and a second portion PL1$v$ extending substantially in a second direction D2 crossing the first direction D1.

The second power source line PL2 may include a first portion PL2$h$ extending substantially in the first direction D1, and a second portion PL2$v$ extending substantially in the second direction D2.

The wiring part may provides signal from the driving part to each of the pixels, and may include scan lines, data lines, light emitting control lines, power supplying line, and initializing power source line.

A first insulating dam DM1, a second insulating dam DM2, and a third insulating dam DM3 may be disposed in the peripheral area NDA. The first insulating dam DM1 may surround the display area DA. The second insulating dam DM2 may be spaced apart from the first insulating dam DM1, and surround the first insulating dam DM1. The third insulating dam DM3 may be spaced apart from the second insulating dam DM2, and surround the second insulating dam DM2.

The first to third insulating dams DM1, DM2, and DM3 may block organic material (see 192 of FIG. 3) of an organic layer of the thin film encapsulation layer (see 190 of FIG. 3) for sealing the display area DA from flowing toward an edge of a substrate (see 100 of FIG. 3), and thus, the first to third insulating dams DM1, DM2, and DM3 may prevent formation of an edge tail of the organic material. As used herein, the "edge tail" may refer to an edge portion of the organic layer that may be formed by flowing outwardly beyond an edge portion of the inorganic layer during manufacture. In general, when an organic layer and an inorganic layer are formed, a mask is placed on the substrate to form a pattern in order to form the thin film encapsulation layer. At this time, the organic layer may penetrate into a gap between the mask and the substrate to form an edge tail. In this case, oxygen or moisture can permeate into the structure of the display area DA through the edge tail, which may deteriorate display quality.

Figure 2:
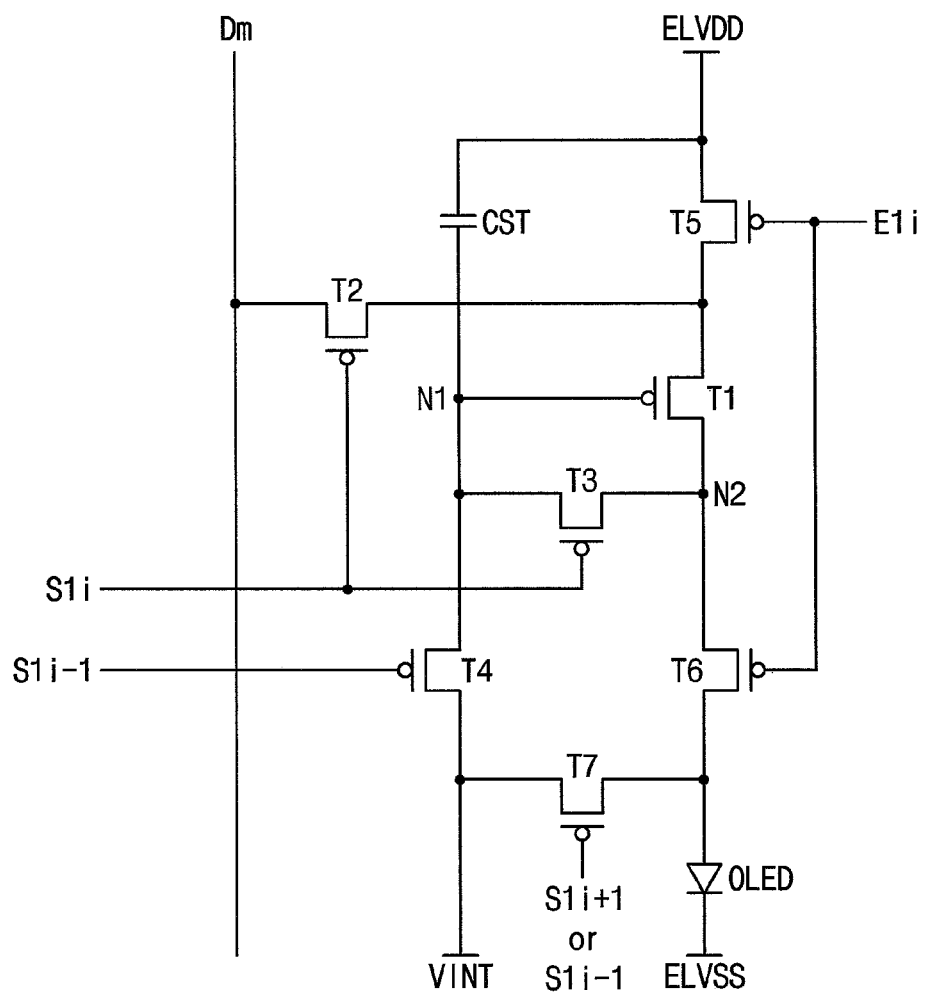
FIG. 2 is an equivalent circuit diagram illustrating a pixel according to an exemplary embodiment.

FIG. 2 is an equivalent circuit diagram illustrating of a pixel according to an exemplary embodiment. FIG. 2 illustrates a pixel connected to an $m^{th}$ data line Dm and $i^{th}$ first scan line S1$i$ as an example.

Referring to FIG. 2, the pixel according to an exemplary embodiment includes an organic light emitting diode OLED, a first transistor T1 to seventh transistor T7, and a storage capacitor Cst.

An anode of the organic light emitting diode OLED is connected to the first transistor T1 via the sixth transistor T6, and a cathode of the organic light emitting diode OLED is connected to the second power source ELVSS. An organic light emitting diode OLED may emit light of a certain brightness that corresponds to the amount of current being supplied from the first transistor T1.

The first power source ELVDD may be set to a higher voltage than the second power source ELVSS, such that current may flow to the organic light emitting diode OLED.

The seventh transistor T7 is connected between an initializing power source Vint and the anode of the organic light emitting diode OLED. Further, the gate electrode of the seventh transistor T7 is connected to the $i+1^{th}$ first scan line S1$i$+1 or $i-1^{th}$ first scan line S1$i$−1.

The seventh transistor T7 is turned-on when the scan signal is being supplied to the $i^{th}$ first scan line S1$i$, and provides the voltage of the initializing power source Vint to the anode of the organic light emitting diode OLED. Here, the initializing power source Vint may be set to a lower voltage than the data signal.

The sixth transistor T6 is connected between the first transistor T1 and the organic light emitting diode OLED. Further, the gate electrode of the sixth transistor T6 is connected to the $i^{th}$ first light emission control line Eli. The sixth transistor T6 is turned-off when the light emission control signal is supplied to the $i^{th}$ first light emission control line Eli, and the sixth transistor T6 is turned-on otherwise.

The fifth transistor T5 is connected between the first power source ELVDD and the first transistor T1. Further, a gate electrode of the fifth transistor T5 is connected to the $i^{th}$ first light emission control line Eli. The fifth transistor T5 is turned-off when the light emission control signal is being supplied to the $i^{th}$ first light emission control line Eli, and the fifth transistor T5 is turned-on otherwise.

A first electrode of the first transistor T1 (driving transistor) is connected to the first power source ELVDD via the fifth transistor T5, and a second electrode of the first transistor T1 is connected to the anode of the organic light emitting diode OLED via the sixth transistor T6. Further, a gate electrode of the first transistor T1 is connected to a first anode N1. The first transistor T1 controls the amount of current flowing from the first power source ELVDD to the second power source ELVSS via the organic light emitting diode OLED in response to the voltage of the first node N1.

The third transistor T3 is connected between the second electrode of the first transistor T1 and the first node N1. Further, a gate electrode of the third transistor T3 is connected to the $i^{th}$ first scan line S1$i$. The third transistor T3 is turned-on when a scan signal is being supplied to the i-th first scan line S1$i$, and electrically connects the second electrode of the first transistor T1 to the first node N1. In this manner, when the third transistor T3 is turned-on, the first transistor T1 may be accessed in a diode form.

The fourth transistor T4 is connected between the first node N1 and the initializing power source Vint. Further, a gate electrode of the fourth transistor T4 is connected to an first scan line S1$i$−1. The fourth transistor T4 is turned-on when a scan signal is being supplied to the first scan line S1$i$−1, and supplies the voltage of the initializing voltage Vint to the first node N1.

The second transistor T2 is connected between the m$^{th}$ data line Dm and the first electrode of the first transistor T1. Further, a gate electrode of the second transistor T2 is connected to the $i^{th}$ first scan line S1$i$. The second transistor T2 is turned-on when a scan signal is being supplied to the $i^{th}$ first scan line S1$i$, and electrically connects the m$^{th}$ data line Dm to the first electrode of the first transistor T1.

The storage capacitor Cst is connected between the first power source ELVDD and the first node N1. The storage capacitor Cst stores a data signal and a voltage corresponding to a threshold voltage of the first transistor T1.

Figure 3:
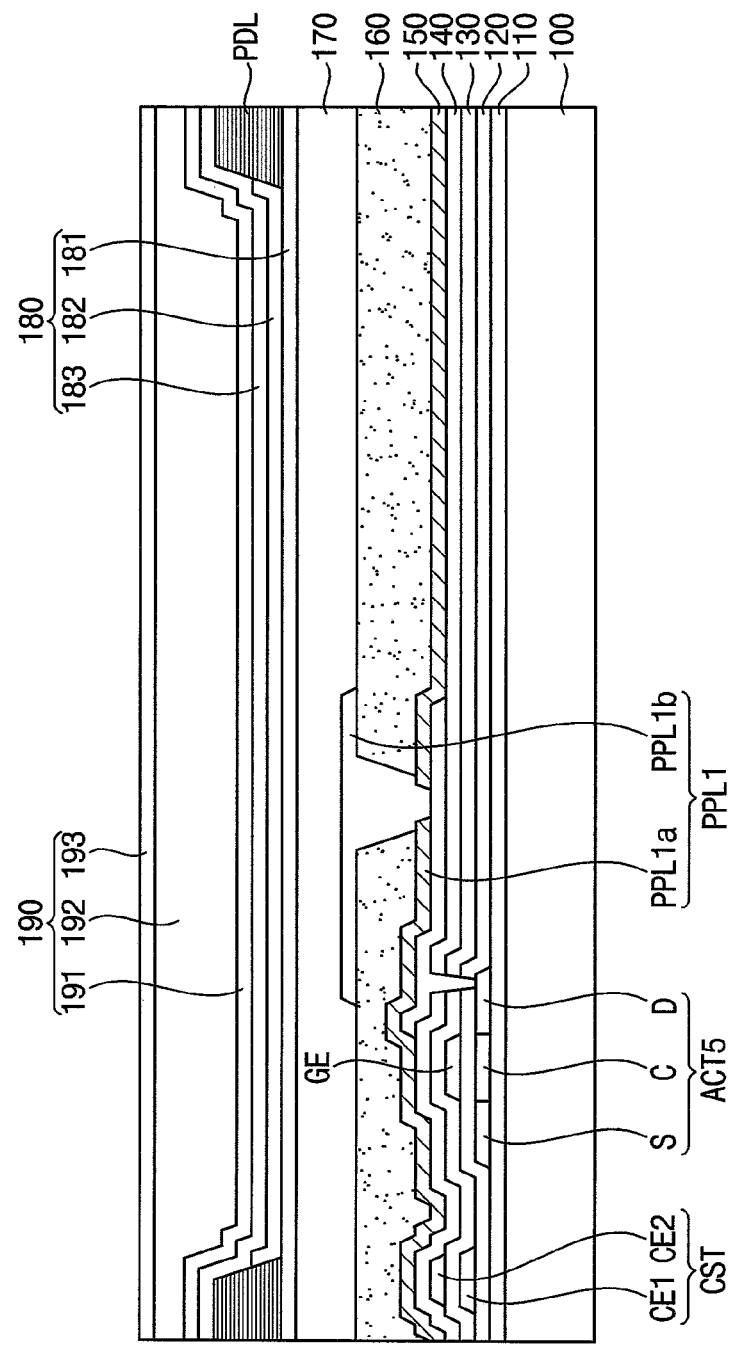
FIG. 3 is a cross-sectional view of a display apparatus according to an exemplary embodiment.

FIG. 3 is a cross-sectional view of a display apparatus according to an exemplary embodiment.

Referring to FIG. 3, the display apparatus may include a substrate 100, a buffer layer 110, an active pattern ACT5, a first gate insulation layer 120, a first gate pattern, a second gate insulation layer 130, a second gate pattern, a inter layer dielectric layer 140, a first data pattern, a first insulation layer 150, a second insulation layer 160, a second data pattern, a third insulation layer 170, a pixel defining layer PDL, a light emitting structure 180, and a thin film encapsulation layer 190.

The substrate 100 may include transparent or opaque insulation materials. For example, the substrate 100 may include a quartz substrate, a synthetic quartz substrate, a calcium fluoride substrate, a fluoride-doped quartz substrate, a sodalime glass substrate, a non-alkali glass substrate, etc. Alternatively, the substrate 100 may include a flexible transparent material, such as a flexible transparent resin substrate (e.g., a polyimide substrate).

The buffer layer 110 may be disposed on the substrate 100. In some exemplary embodiments, the buffer layer 110 may be disposed on the entire substrate 100. The buffer layer 110 may prevent diffusion of metal atoms and/or impurities from the substrate 100 into the active pattern ACT5. In addition, the buffer layer 110 may control a heat transfer rate in a crystallization process for forming the active pattern ACT5, such that the active pattern ACT may be formed substantially uniform.

The active pattern ACT5 may be disposed on the buffer layer 110. The active pattern ACT5 may include amorphous silicon or polycrystalline silicon. In some exemplary embodiments, the active pattern ACT5 may include an oxide including at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The active pattern ACT5 may include a source region S and a drain region D doped with an impurity, and a channel region C disposed between the source region S and the drain region D.

The first gate insulation layer 120 may be disposed on the buffer layer 110. The first gate insulation layer 120 may be uniformly formed on the buffer layer 110 along a profile of the active pattern ACT5. The first gate insulation layer 120 may include a silicon compound, metal oxide, etc.

The first gate pattern may be disposed on the first gate insulation layer 120. The first gate pattern may include a gate electrode GE, a first storage electrode CE1, and a signal line, such as a gate line. The first gate pattern may be formed using metal, alloy, metal nitride, conductive metal oxide, transparent conductive material, etc.

The second gate insulation layer 130 may be disposed on the first gate insulation layer 120, on which the first gate pattern is disposed. For example, the second gate insulation layer 130 may be uniformly formed on the first gate insulation layer 120 along a profile of the first gate pattern. The second gate insulation layer 130 may be substantially thin, such that a stepped portion may be formed at a portion of the second gate insulation layer 130 adjacent to the first gate pattern. In some exemplary embodiments, the second gate insulation layer 130 may be relatively thick to sufficiently cover the active pattern ACT5, so that the second gate insulation layer 130 may have a substantially level surface. The second gate insulation layer 130 may include a silicon compound, a metal oxide, or the like. The second gate insulation layer 130 may be formed of a plurality of layers.

The second gate pattern may be disposed on the second gate insulation layer 130. The second gate pattern may include a second storage electrode CE2. The second storage electrode CE2 may be overlapped with the first storage electrode CE1 to form a storage capacitor CST. The second gate pattern may be formed using metal, alloy, metal nitride, conductive metal oxide, transparent conductive material, etc.

The inter layer dielectric layer 140 may be disposed on the second gate insulation layer 130 on which the second gate pattern is disposed. For example, the inter layer dielectric layer 140 may sufficiently cover the second gate pattern on the second gate insulation layer 130, and may have a substantially planar top surface without creating a step portion adjacent to the second gate pattern. In some exemplary embodiments, the inter layer dielectric layer 140 may cover the second gate pattern on the second gate insulation layer 130, and may have substantially uniform thickness along a profile of the second gate pattern. The inter layer dielectric layer 140 may include a silicon compound, a metal oxide, or the like. The inter layer dielectric layer 140 may be formed of a plurality of layers.

The first data pattern may be disposed on the inter layer dielectric layer 140. The first data pattern may include a first layer PPL1$a$ of the first power supplying line PPL1, and a signal line, such as a data line. The first data pattern may be formed using metal, alloy, metal nitride, conductive metal oxide, transparent conductive material, etc. For example, the first data pattern may have a laminated structure including a first layer including titanium (Ti), a second layer including aluminum (Al), and a third layer including titanium (Ti).

The first layer PPL1$a$ of the first power supplying line PPL1 may be electrically connected to the drain region D of the active pattern ACT5 through a contact hole formed through the first gate insulation layer 120, the second gate insulation layer 130, and the inter layer dielectric layer 140.

The active pattern ACT5 and the gate electrode GE may form a thin film transistor. For example, the thin film transistor may be the fifth transistor T5 of FIG. 2.

The first insulation layer 150 may be disposed on the inter layer dielectric layer 140 on which the first data pattern is disposed. The first insulation layer 150 may include inorganic material, such as a silicon compound, metal oxide, etc.

The second insulation layer 160 may be disposed on the first insulation layer 150. The second insulation layer 160 may have a single-layered structure or a multi-layered structure including at least two insulation films. The second insulation layer 160 may be formed using an organic material. For example, the second insulation layer 160 may include photoresist, acryl-based resin, polyimide-based resin, polyamide-based resin, siloxane-based resin, etc.

The second data pattern may be disposed on the second insulation layer 160. The second data pattern may include a second layer PPL1b of the first power supplying line PPL1 and a signal line, such as a data line. The second data pattern may be formed using metal, alloy, metal nitride, conductive metal oxide, transparent conductive material, etc. For example, the second data pattern may have a laminated structure including a first layer including titanium (Ti), a second layer including aluminum (Al), and a third layer including titanium (Ti).

The second layer PPL1b of the first power supplying line PPL1 may be electrically connected to the first layer PPL1a of the first power supplying line PPL1 through a contact hole formed through the first and second insulation layers 150, 160, so that the first layer PPL1a of the first power supplying line PPL1 and the second layer PPL1b of the first power supplying line PPL1 form the first power supplying line PPL1. The first power supplying line PPL1 may be electrically connected to the first power source line (see PL1 of FIG. 1).

The third insulation layer 170 may be disposed on the second insulation layer 160 on which the second data pattern is disposed. The third insulation layer 170 may be formed using an organic material. For example, the third insulation layer 170 may include photoresist, acryl-based resin, polyimide-based resin, polyamide-based resin, siloxane-based resin, etc. In some exemplary embodiments, the third insulation layer 170 may include inorganic material, such as a silicon compound, metal oxide, etc.

The light emitting structure 180 may include a first electrode 181, an emission layer 182, and a second electrode 183.

The first electrode 181 may be disposed on the third insulation layer 170. The first electrode 181 may include a reflective material or a transmissive material in accordance with the emission type of the display apparatus. For example, the first electrode 181 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In some exemplary embodiments, the first electrode 181 may have a single layer structure or a multi layered structure, which may include a metal film, an alloy film, a metal nitride film, a conductive metal oxide film and/or a transparent conductive film.

The pixel defining layer PDL may be disposed on the third insulation layer 170 on which the first electrode 181 is disposed. The pixel defining layer PDL may be formed using an organic material. For example, the pixel defining layer PDL may include photoresist, acryl-based resin, polyimide-based resin, polyamide-based resin, siloxane-based resin, etc. In some exemplary embodiments, an opening which exposes the first electrode 181 may be formed by etching the pixel defining layer PDL. An emitting area and a non-emitting area of the display apparatus may be defined by the opening of the pixel defining layer PDL. For example, a portion where the opening of the pixel defining layer PDL is formed may correspond to the emitting area, and the non-emitting area may correspond to a portion adjacent to the opening of the pixel defining layer PDL.

The light emitting layer 182 may be disposed on the first electrode 181 exposed through the opening of the pixel defining layer PDL. In addition, the light emitting layer 182 may extend on a sidewall of the opening of the pixel defining layer PDL. In some exemplary embodiments, the light emitting layer 182 may include an organic light emitting layer (EL), a hole injection layer (HIL), a hole transfer layer (HTL), an electron transfer layer (ETL), an electron injection layer (EIL), etc. In some exemplary embodiments, layers of the light emitting layer 182 except for the organic emission layer, such as the hole injection layer, the hole transport layer, the electron transport layer, and the electron injection layer may be formed in common to correspond to a plurality of pixels. In some exemplary embodiments, a plurality of organic light emitting layers may be formed using light emitting materials generating different colors of light, such as a red color of light, a green color of light and a blue color of light in accordance with color pixels of the display device. In some exemplary embodiments, the organic light emitting layer of the of the light emitting layer 182 may include a plurality of stacked light emitting materials for generating a red color of light, a green color of light, and a blue color of light, to thereby emit a white color of light. Here, elements of the light emitting layer 182 may be commonly formed to correspond to a plurality of pixels, and each pixel can be divided by a color filter layer.

The second electrode 183 may be disposed on the pixel defining layer PDL and the light emitting layer 182. The second electrode 183 may include a transmissive material or a reflective material in accordance with the emission type of the display device. For example, the second electrode 183 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In some exemplary embodiments, the second electrode 183 may also have a single layer structure or a multi layered structure, which may include a metal film, an alloy film, a metal nitride film, a conductive metal oxide film and/or a transparent conductive film.

The thin film encapsulation layer 190 may be disposed on the second electrode 183. The thin film encapsulation layer 190 may prevent penetration of moisture and oxygen from the outside. The thin film encapsulation layer 190 may include a first inorganic layer 191, an organic layer 192 and a second inorganic layer 193. The first inorganic layer 191, the organic layer 192, and the second inorganic layer 193 may be sequentially stacked on the second electrode 183.

The thin film encapsulation layer 190 may include at least one organic layer and at least one inorganic layer. The at least one organic layer and the at least one inorganic layer may be alternately stacked with each other. In the illustrated exemplary embodiment, the thin film encapsulation layer 190 includes the first and second inorganic layers and one organic layer therebetween, but the inventive concepts are not limited thereto.

Figure 4:
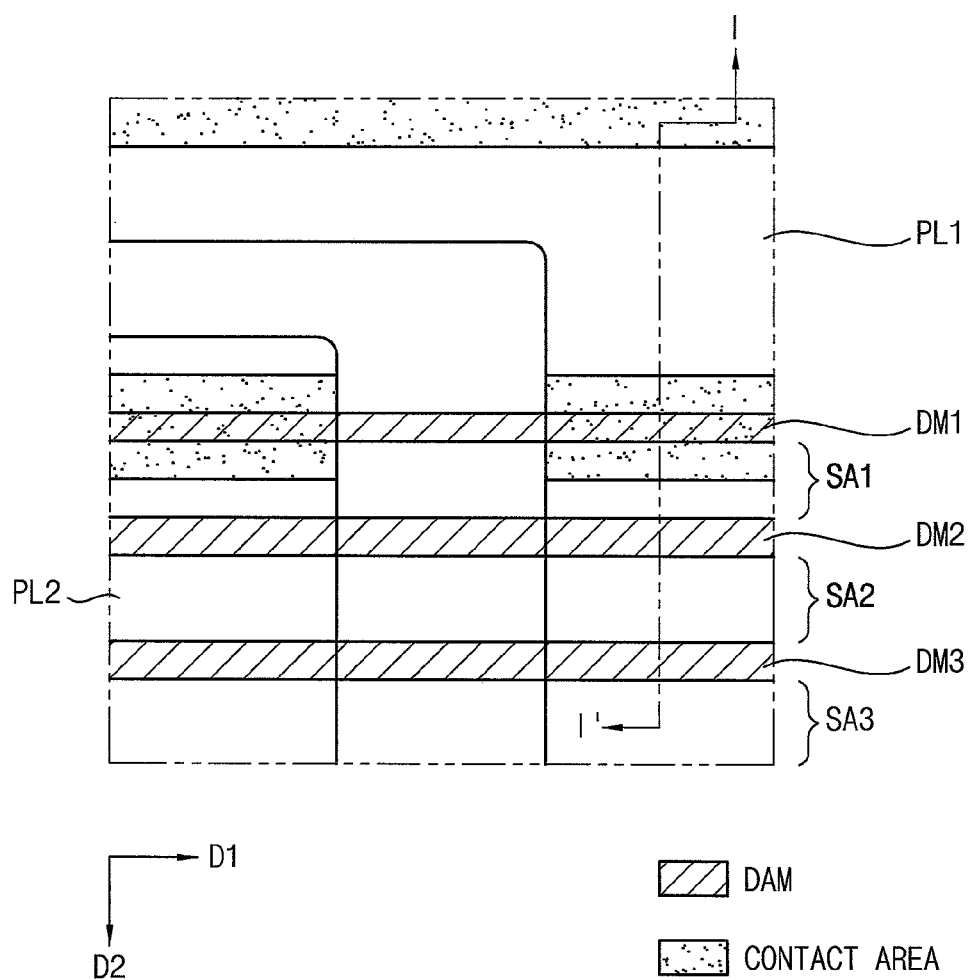
FIG. 4 is an enlarged view of 'A' portion of FIG. 1.
Figure 5:
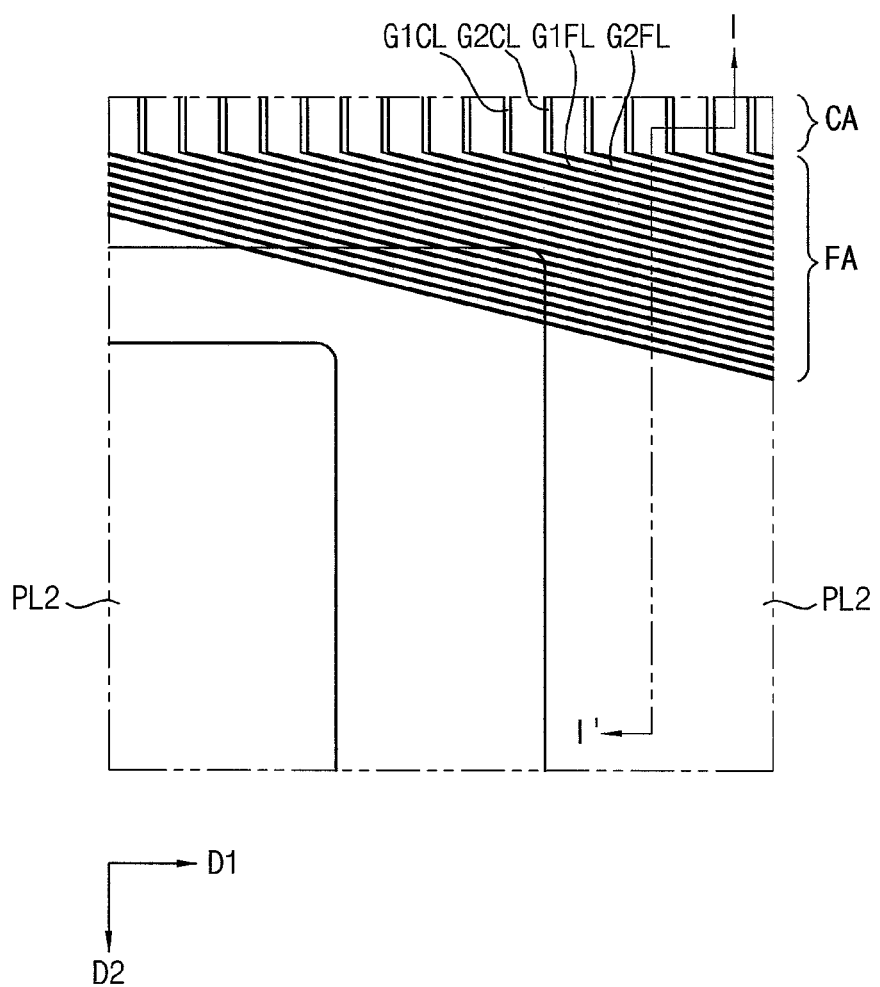
FIG. 5 is a plan view of a first gate pattern and a second gate pattern in a fan-out area of the display apparatus of FIG. 4.
Figure 6:
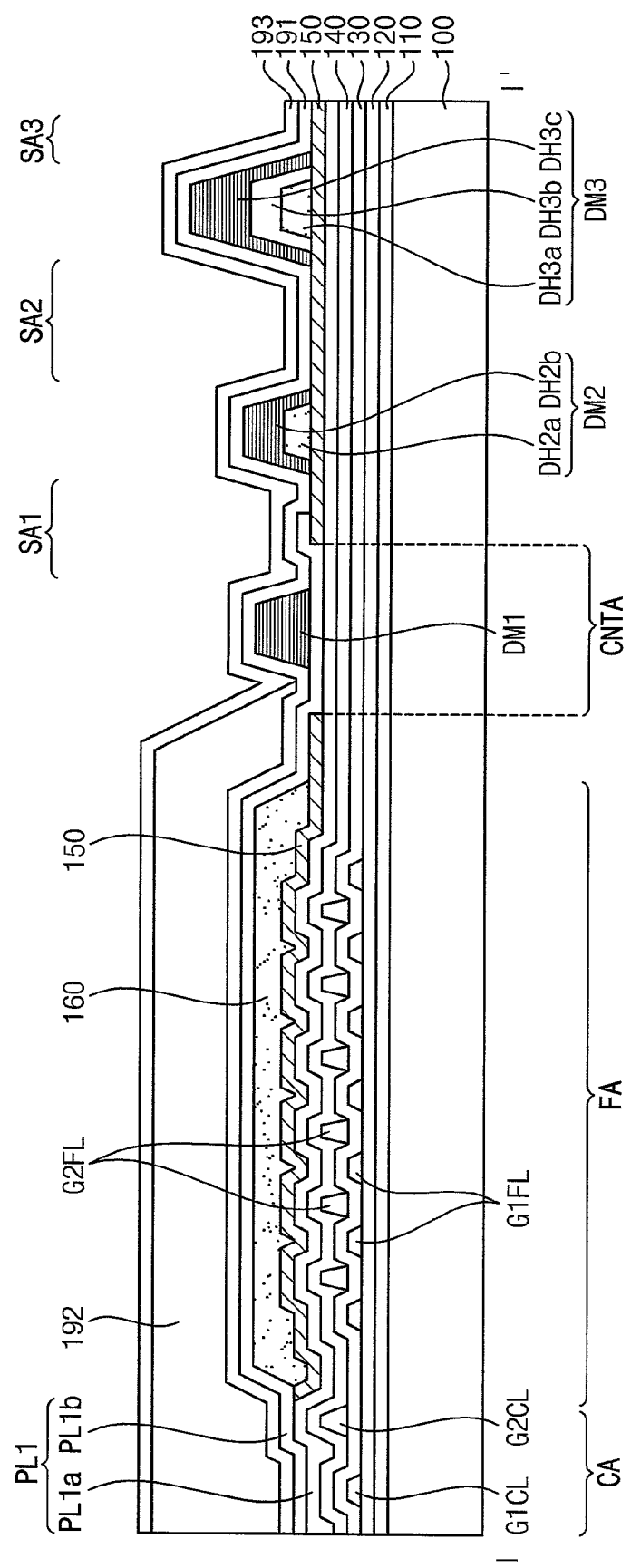
FIG. 6 is a cross-sectional view taken along line I-I' of FIGS. 4 and 5.

FIG. 4 is an enlarged view of 'A' portion of FIG. 1. FIG. 5 is a plan view of a first gate pattern and a second gate pattern in a fan-out area of the display apparatus of FIG. 4. FIG. 6 is a cross-sectional view taken along line I-I' of FIGS. 4 and 5.

Referring to FIGS. 1 and 3 to 6, the display apparatus may include the substrate 100, the buffer layer 110, the first gate insulation layer 120, the first gate pattern, the second gate insulation layer 130, the second gate pattern, the inter layer dielectric layer 140, the first data pattern, the first insulation layer 150, the second insulation layer 160, the second data pattern, the first insulating dam DM1, the second insulating dam DM2, the third insulating dam DM3, the first inorganic layer 191, the organic layer 192, and the second inorganic layer 193.

The buffer layer 110 may be disposed on the substrate 100. The firs gate insulation layer 120 may be disposed on the buffer layer 110. The first gate pattern may be disposed on the first gate insulation layer 120. The first gate pattern may include a plurality of first gate connecting lines G1CL, and a plurality of first gate fan-out lines G1FL.

The second gate insulation layer 130 may be disposed on the first gate insulation layer 120 on which the first gate pattern is formed. The second gate pattern may be disposed on the second gate insulation layer 130. The second gate pattern may include a plurality of second gate connecting lines G2CL and a plurality of second gate fan-out lines G2FL.

The inter layer dielectric layer 140 may be disposed on the second gate insulation layer 130. The first data pattern may be disposed on the inter layer dielectric layer 140.

The first data pattern may include a first layer PL1*a* of the first power source line PL1.

The first insulation layer 150 may be disposed on the inter layer dielectric layer 140 on which the first data pattern is disposed. The second insulation layer 160 may be disposed on the first insulation layer 150. A third insulation layer (see 170 of FIG. 3) may be disposed on the first insulation layer 150 on which the second insulation layer 160 is disposed. The second data pattern may be disposed on the first insulation layer 150, on which the second and third insulation layers 160 and 170 are disposed.

The second data pattern may include a second layer PL1*b* of the first power source line PL1. The first power source line PL1 may include the first layer PL1*a* and the second layer PL1*b*.

The first gate fan-out line G1FL may be disposed in a fan-out area FA in the peripheral area NDA. The plurality of first gate fan-out lines G1FL in the fan-out area FA may extend (or fanned-out) along a direction from the peripheral area NDA to the display area DA. The plurality of first gate fan-out line G1FL may be electrically connected to the plurality of first gate connecting line G1CL, respectively.

Each of the plurality of first gate connecting lines G1CL may extend substantially in the second direction D2, be arranged in parallel with each other, and be disposed in a connecting area CA between the fan-out area FA and the display area DA.

The second gate fan-out line G2FL may be disposed in the fan-out area FA. The plurality of second gate fan-out lines G2FL in the fan-out area FA may extend (or fanned-out) along a direction from the peripheral area NDA to the display area DA. The plurality of second gate fan-out lines G2FL may be electrically connected to the plurality of second gate connecting lines G2CL, respectively.

Each of the plurality of second gate connecting lines G2CL may extend substantially in the second direction D2, be arranged in parallel with each other, and be disposed in the connecting area CA.

As such, the plurality of first gate fan-out lines G1FL and the plurality of second gate fan-out lines G2FL may extend (or be fanned out) in the fan-out area FA, and the first gate fan-out lines G1FL and the second gate fan-out lines G2FL may be alternately disposed. In this manner, a gap between the first gate fan-out line G1FL and the second gate fan-out line G2FL may be smaller than the first gate connecting line G1CL and the second gate connecting line G2CL, in plan view, as shown in FIG. 5.

Here, in the fan-out area FA, the first and second gate fan-out lines G1FL and G2FL may be disposed to overlap each other or spaced apart from each other with relatively small gap, so that an upper surface of the first layer PL1*a* of the first power source line PL1 in the fan-out area FA may not be even, and form a stepped portion.

Generally, when external light is reflected by the uneven upper surface (by the stepped portion), users may visually recognize it and degrade display quality. However, the first power source line PL1 according to an exemplary embodiment in the fan-out area FA has a dual layer structure including the first layer PL1*a* and the second layer PL1*b* of the first power source line PL1. An organic insulation material having sufficient thickness is disposed between the first layer PL1*a* and the second layer PL1*b* of the first power source line PL1. In this manner, since the upper surface of the second layer PL1*b* of the first power source line PL1 is sufficiently flat, reflection of external light which would otherwise occur in an uneven surface would be significantly reduced.

The first power source line PL1 has the dual layer structure. In a cross-sectional view where the first insulating dam DM1 is overlapped with the first power source line PL1, the first layer PL1*a* and the second layer PL1*b* of the first power source line PL1 make contact with each other in a contact area CNTA, where the first insulation layer 150 is opened, and in the connecting area CA. In this manner, the problem of external light reflection can be minimized while minimizing wiring resistance. Also, it is possible to solve the problem related to adhesion failure of the first insulating dam DM1, which will be described in more detail later.

In the connecting area CA, since the gap between the wirings of the first gate pattern and the second gate pattern is wider than that in the fan-out area FA, problems of reflection of external light due to uneven surface of the wirings may be relatively less likely. Thus, even if the first layer PL1*a* and the second layer PL1*b* of the first power source line PL1 are in contact with each other in the connecting area CA, the display quality may not be affected.

In addition, the second power source line PL2 has a dual layer structure and functions substantially similar to those of the first power source line PL1, and thus, repeated descriptions thereof will be omitted to avoid redundancy.

The first insulating dam DM1 may be disposed on the second layer PL1*b* of the first power source line PL1 and contact the second layer PL1*b*. The first insulating dam DM1 may be formed from the same layer as the pixel defining layer (see PDL of FIG. 3)

When the first insulating dam DM1 is formed of the same material as the PDL including the organic material, adhesion between the first insulation dam DM1 and the first insulation layer 150 may not be good, which may cause the first insulating dam DM1 to be peeled off, when the first insulating dam DM1 is formed directly on the first insulation layer 150 including an inorganic material. However, the first insulating dam DM1 according to an exemplary embodiment is formed to contact with the second layer PL1*b* of the first power source line PL1, which may prevent the insulating dam from being peeled off due to low adhesion.

The second insulating dam DM2 may include a first portion DH2*a*, which includes the same material the second insulation layer 160 or the third insulation layer 170, and a second portion DH2*b* disposed on the first portion DH2*a* and including the same material the pixel defining layer PDL.

The third insulating dam DM3 may include a first portion DH3*a* including the same material as the second insulation layer 160, a second portion DH3*b* which is disposed on the first portion DH3*a* and includes the same material as the third insulation layer 170, and a third portion DH3*c* which is disposed on the second portion DH3*b* and includes the same material as the pixel defining layer PDL.

However, the inventive concepts are not limited to the materials forming the first to third insulation dams DM1, DM2 and DM3, and materials forming the first to third insulation dams DM1, DM2, and Dm3 may include various other materials so long as the third insulating dam DM3 has a height greater than the second insulating dam DM2, and the second insulating dam DM2 has a height greater than the first insulating dam DM1.

Each of the first to third insulation dams DM1, DM2, and DM3 may have substantially a constant tapered shape, in which a width of the upper surface is less than a width of the lower surface in a cross-sectional view.

In the peripheral area NDA, spaced apart areas SA1, SA2, and SA3 may be formed, which may not include a layer including an organic insulating material.

The first inorganic layer 191 may be disposed on the first to third insulating dams DM1, DM2, and DM3. The organic layer 192 and the second inorganic layer 193 may be disposed on the first inorganic layer 191.

Figure 7:
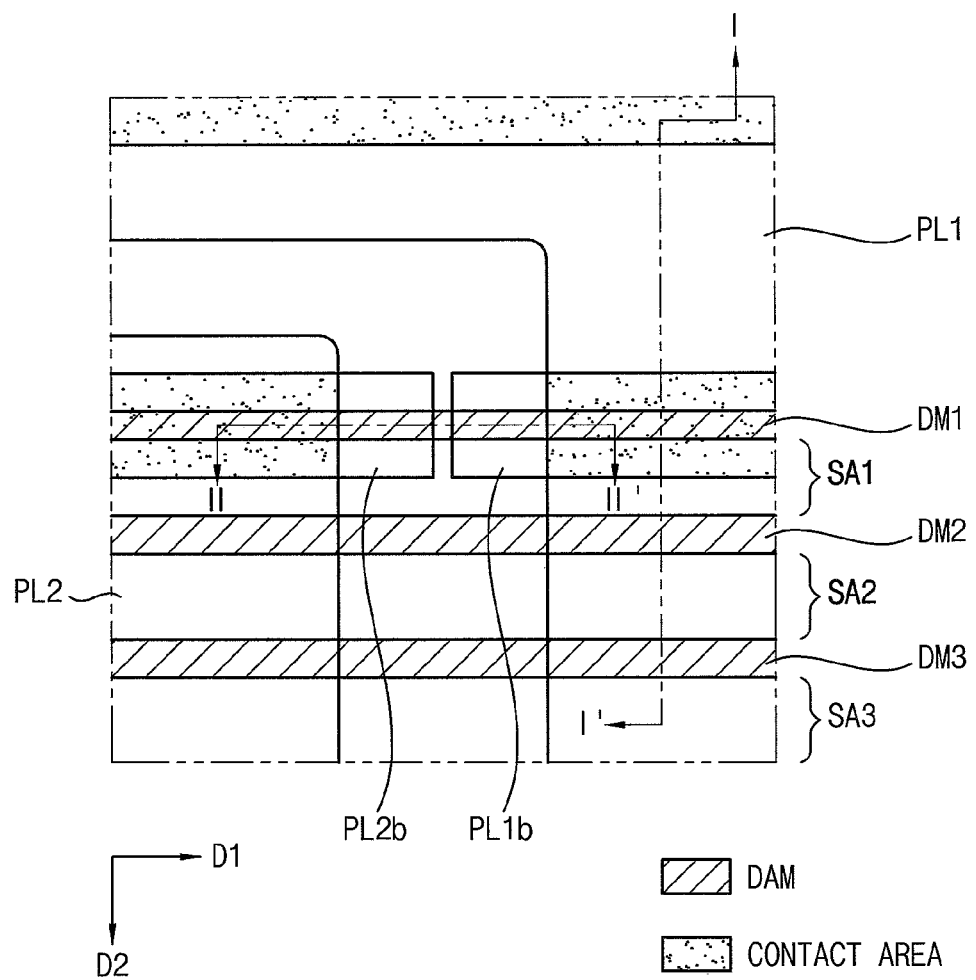
FIG. 7 is a partially enlarged plan view of a display apparatus according to an exemplary embodiment.
Figure 8:
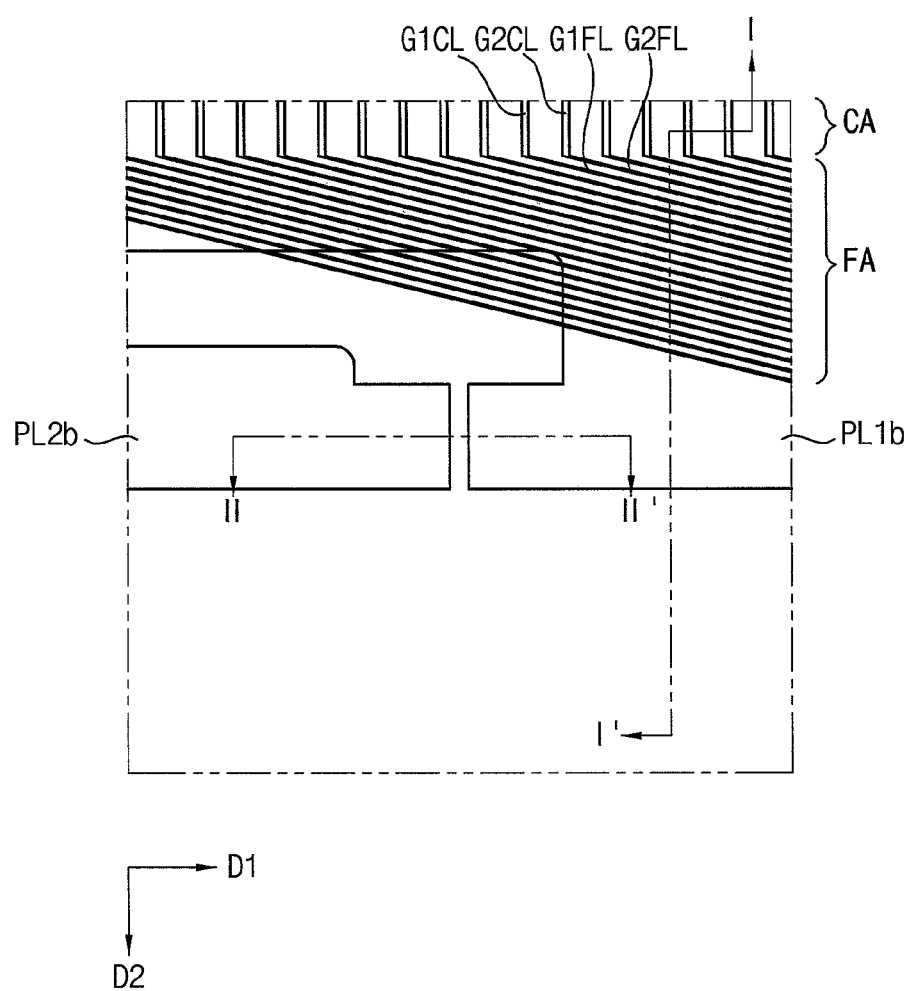
FIG. 8 is a plan view illustrating a first gate pattern, a second gate pattern, and a second layer pattern of first and second power source lines in a fan-out area of the display apparatus of FIG. 7.
Figure 9:
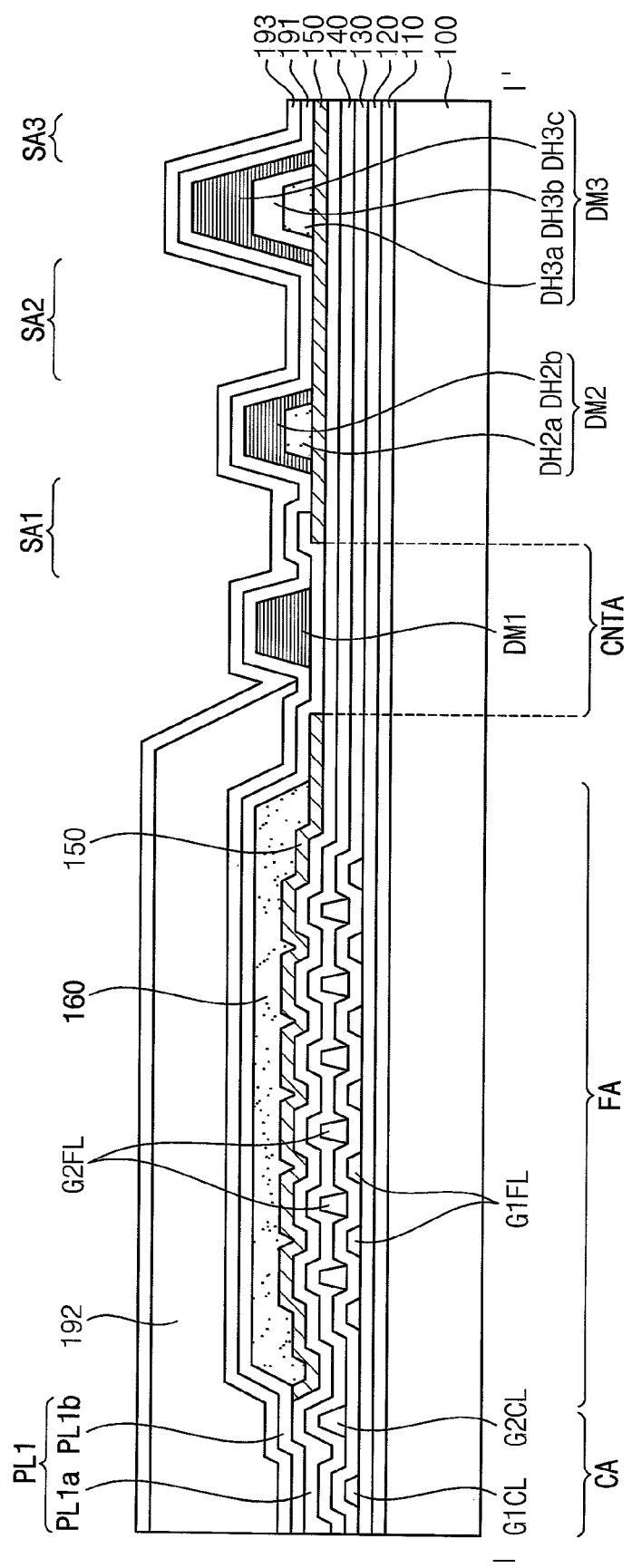
FIG. 9 is a cross-sectional view taken along line I-I' of FIGS. 7 and 8.
Figure 10:
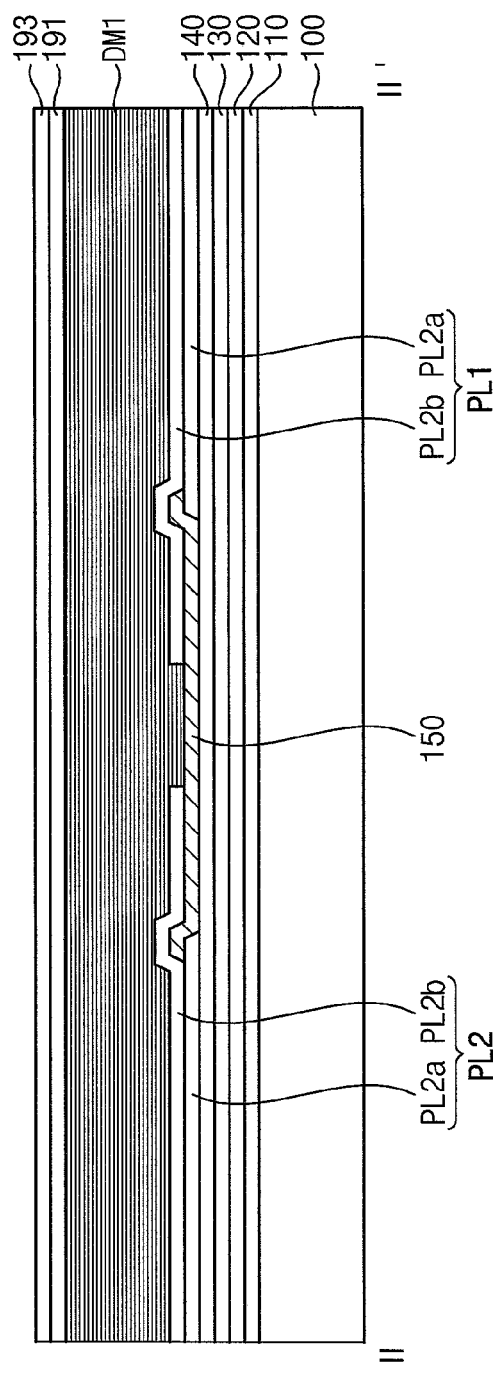
FIG. 10 is a cross-sectional view taken along line II-II' of FIGS. 7 and 8.

FIG. 7 is a partially enlarged plan view of a display apparatus according to an exemplary embodiment. FIG. 8 is a plan view illustrating a first gate pattern, a second gate pattern, and a second layer pattern of first and second power source lines in a fan-out area of the display apparatus of FIG. 7. FIG. 9 is a cross-sectional view taken along line I-I' of FIGS. 7 and 8. FIG. 10 is a cross-sectional view taken along line II-II' of FIGS. 7 and 8.

Referring to FIGS. 7 to 10, the display apparatus according to an exemplary embodiment may be substantially same as the display apparatus of FIGS. 1 to 6, except that the second layer PL1*b* of the first power supply line PL1 of the first power supply line PL1, and the second layer PL2*b* of the second power supply line PL2 of the second power supply line PL2 include an extended portion. As such, repeated descriptions of the substantially the same elements will be omitted to avoid redundancy.

The display apparatus may include the substrate 100, the buffer layer 110, the first gate insulation layer 120, the first gate pattern, the second gate insulation layer 130, the second gate pattern, the inter layer dielectric layer 140, the first data pattern, the first insulation layer 150, the second insulation layer 160, the second data pattern, the first insulating dam DM1, the second insulating dam DM2, the third insulating dam DM3, the first inorganic layer 191, the organic layer 192, and the second inorganic layer 193.

The first gate pattern may include a plurality of gate connecting lines G1CL, and a plurality of first gate fan-out lines G1FL. The second gate pattern may include a plurality of second gate connecting line G2CL and a plurality of second gate fan-out line G2FL.

The second data pattern may include a second layer PL1*b* of the first power source line PL1. The first power source line PL1 may include the first layer PL1*a* and the second layer PL1*b*.

In a plan view, the second layer PL1*b* of the first power source line PL1 may have an extended portion which is protruded along the first insulating dam DM1. The second layer PL2*b* of the second power source line PL2 may have an extended portion which is protruded along the first insulating dam DM1. As such, where the first insulating dam DM1 is formed, a distance between the second layer PL1*b* of the power source line PL1 and the second layer PL2*b* of the second power source line PL2 may be less than that of the display apparatus of FIGS. 1 to 6. In this manner, a portion where the first insulating dam DM1 is in direct contact with the first insulation layer 150 including the inorganic insulation material may be minimized. Accordingly, a problem of adhesion failure of the first insulating dam DM can be minimized.

According to the exemplary embodiments, a display apparatus includes a substrate, a first layer of the first power source line disposed in a peripheral area, which is a non-displaying area disposed adjacent to a display area configured to display an image, a second layer of the first power source line disposed on the first layer of the first power source line and electrically connected to the first layer of the first power source line, a first insulation layer disposed between the first and second layers of the first power source line, and a first insulating dam disposed on and contacting the second layer of the first power source line, which is disposed in the peripheral area and surrounding the display area Accordingly, a first power source line has a dual layer structure. In a plane view where the first insulating dam is overlapped with the first power source line, the first layer and the second layer of first power source line contact with each other in a contact area, in which the first insulation layer is opened. Thus, the problem of external light reflection can be minimized while minimizing wiring resistance.

In addition, the display apparatus further includes a second insulation layer including organic insulation material, which is disposed between the first layer and the second layer of the first power source line, so that problem of external light reflection in a fan-out area can be minimized.

Figure 11:
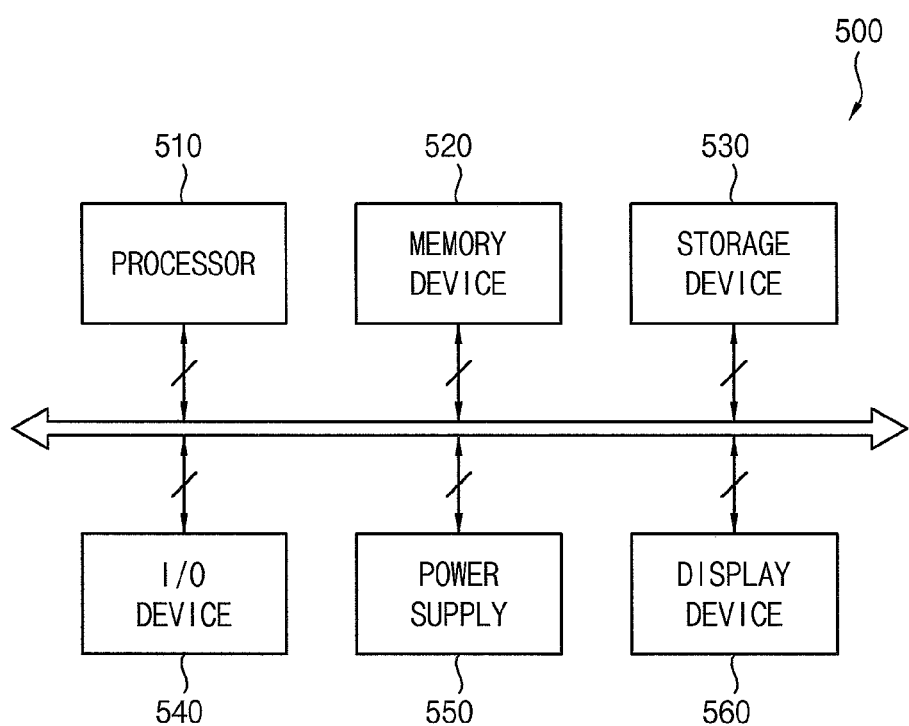
FIG. 11 is a block diagram illustrating an electronic device according to an exemplary embodiment.
Figure 12A:
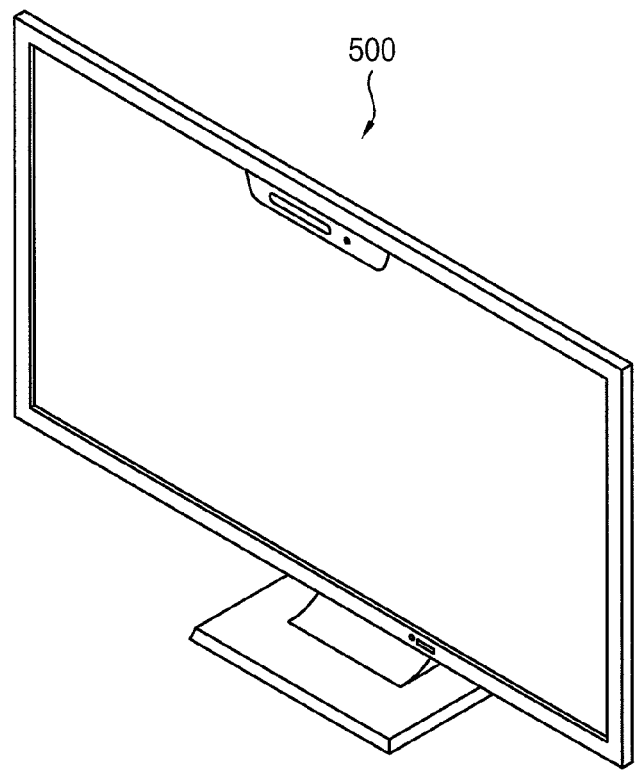
FIG. 12A is a schematic view of a television according to an exemplary embodiment.
Figure 12B:
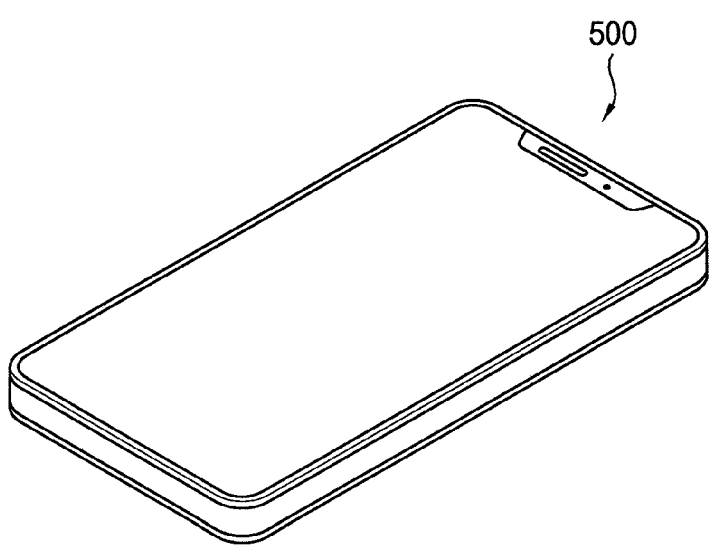
FIG. 12B is a schematic view of a smart phone according to an exemplary embodiment.

FIG. 11 is a block diagram illustrating an electronic device according to an exemplary embodiment. FIG. 12A is a schematic view of a television according to an exemplary embodiment. FIG. 12B is a schematic view of a smart phone according to an exemplary embodiment.

Referring to FIGS. 11 through 12B, the electronic device 500 may include a processor 510, a memory device 520, a storage device 530, an input/output (I/O) device 540, a power supply 550, and a display device 560. The display device 560 may be the display apparatus of FIG. 1. In addition, the electronic device 500 may further include a plurality of ports for communicating with a video card, a sound card, a memory card, a universal serial bus (USB) device, other electronic devices, etc. In an exemplary embodiment, as illustrated in FIG. 12A, the electronic device 500 may be implemented as a television. In another exemplary embodiment, as illustrated in FIG. 12B, the electronic device 500 may be implemented as a smart phone. However, the inventive concepts are not limited to a particular type of an electronic device 500. For example, the electronic device 500 may be implemented as a cellular phone, a video phone, a smart pad, a smart watch, a tablet PC, a car navigation system, a computer monitor, a laptop, a head mounted display (HMD), etc.

The processor 510 may perform various computing functions. The processor 510 may be a micro processor, a central processing unit (CPU), an application processor (AP), etc. The processor 510 may be coupled to other components via an address bus, a control bus, a data bus, etc. Further, the processor 510 may be coupled to an extended bus, such as a peripheral component interconnection (PCI) bus. The memory device 520 may store data for operations of the electronic device 500. For example, the memory device 520 may include at least one non-volatile memory device, such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device, such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device such as a keyboard, a keypad, a mouse device, a touchpad, a touch-screen, etc., and an output device such as a printer, a speaker, etc. The power supply 550 may provide power for operations of the electronic device 500.

The display device 560 may be coupled to other components via the buses or other communication links. In some exemplary embodiments, the display device 560 may be included in the I/O device 540. As described above, the display device 560 may include an insulating dam having a rigid structure, which may not deteriorate the visibility of the display device 560 by the wirings in the peripheral area. As such, the display apparatus include a substrate, a first layer of the first power source line disposed in a peripheral area, which is a non-displaying area disposed adjacent to a display area configured to display an image, a second layer of the first power source line disposed on the first layer of the first power source line and electrically connected to the first layer of the first power source line, a first insulation layer disposed between the first and second layers of the first power source line, and a first insulating dam disposed on and contacting the second layer of the first power source line, which is disposed in the peripheral area and surrounding the display area.

A display apparatus generally includes a display area for displaying an image and a peripheral area surrounding the display area, which is a non-display area. During manufacture, an insulating dam may be formed in the peripheral area of the display apparatus due to a process necessity or the like. The insulating dam, however, may be separated or peeled off due to its layered structure during manufacture or use. In addition, a surface of a power source line, which may be formed of a source/drain metal in the peripheral area, may not be flat and cause external light to be reflected, thereby deteriorating the visibility of the display apparatus.

According to the exemplary embodiments, a display apparatus includes a substrate, a first power source line disposed in a peripheral area includes a first layer and a second layer disposed on the first layer and electrically connected to the first layer, a first insulation layer disposed between the first and second layers of the first power source line, and a first insulating dam disposed on and contacting the second layer of the first power source line, disposed in the peripheral area, and surrounding the display area.

The first power source line according to exemplary embodiments has a dual layer structure. The first layer and the second layer of the first power source line contact each other in an opening of the first insulation layer overlapping the first insulating dam. As such, the problem of external light reflection can be minimized while minimizing wiring resistance.

In addition, the display apparatus may further include a second insulation layer including organic insulation material disposed between the first and second layers of the first power source line, so that problem of external light reflection in a fan-out area can be minimized.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus, comprising:
a substrate;
a first power source line disposed in a peripheral area adjacent to a display area configured to display image, the first power source line comprising a first layer and a second layer disposed on the first layer and electrically connected to the first layer;
a first gate pattern disposed between the first layer of the first power source line and the substrate, the first gate pattern comprising a first gate fan-out line in the peripheral area and a first gate connecting line connected to the first gate fan-out line and extending between the first gate fan-out line and the display area;
a first insulation layer disposed between the first layer and the second layer of the first power source line;
a second insulation layer disposed between the first insulation layer and the second layer of the first power source line; and
a first insulating dam disposed on and contacting the second layer of the first power source line, the first insulating dam disposed in the peripheral area and surrounding the display area.

2. The display apparatus of claim 1, wherein the first insulation layer comprises inorganic insulation material, and the second insulation layer comprises organic insulation material.

3. The display apparatus of claim 1, wherein:
the second insulation layer is disposed between the first insulation layer and the second layer of the first power source line on the first gate fan-out line; and
an upper surface of the second insulation layer is substantially flat such that an upper surface of the second layer of the first power source line is substantially flat.

4. The display apparatus of claim 1, wherein:
the first insulation layer has an opening overlapping the first insulating dam; and
the first layer and the second layer of the first power source line contact each other in the opening of the first insulation layer.

5. The display apparatus of claim 1, further comprising:
a first gate insulation layer disposed between the first gate pattern and the first layer of the first power source line.

6. The display apparatus of claim 1, wherein the first and second insulation layers are opened on the first gate connecting line such that the first layer of the first power source line contacts the second layer of the first power source line.

7. The display apparatus of claim 1, further comprising:
a second gate pattern disposed between the first gate pattern and the first layer of the first power source line; and
a second gate insulation layer disposed between the first gate pattern and the second gate pattern.

8. The display apparatus of claim 7, wherein:
the second gate pattern comprises:
a second gate fan-out line disposed in the peripheral area; and
a second gate connecting line disposed between the second gate fan-out line and the display area, and connected to the second gate fan-out line.

9. The display apparatus of claim 8, wherein a gap between the first gate fan-out line and the second gate fan-out line is less than a gap between the first gate connecting line and the second gate connecting line in a plan view.

10. The display apparatus of claim 8, wherein:
the second insulation layer is disposed between the first insulation layer and the second layer of the first power source line on the first and second gate fan-out lines; and
an upper surface of the second insulation layer is substantially flat such that an upper surface of the second layer of the first power source line is substantially flat.

11. The display apparatus of claim 1, further comprising:
a second insulating dam disposed on the first insulation layer in the peripheral area, spaced apart from the first insulating dam, surrounding the first insulating dam, and having a height greater than that of the first insulating dam.

12. The display apparatus of claim 11, further comprising:
a third insulating dam disposed on the first insulation layer in the peripheral area, spaced apart from the second insulating dam, surrounding the second insulating dam, and having a height greater than that of the second insulating dam.

13. The display apparatus of claim 12, further comprising:
a first power supplying line disposed in the display area and comprising a first layer electrically connected to the first layer of the first power source line, and a second layer electrically connected to the first layer of the first power source line;
a third insulation layer disposed on the second layer of the first power supplying line and the second insulation layer; and
a pixel defining layer disposed on the third insulation layer.

14. The display apparatus of claim 13, wherein the first insulating dam and the pixel defining layer comprise the same material.

15. The display apparatus of claim 14, wherein the second insulating dam comprises a first portion comprising the same material as the second insulation layer or the third insulation layer, and a second portion comprising the same material as the pixel defining layer.

16. The display apparatus of claim 15, wherein the third insulating dam comprises a first portion comprising the same material as the second insulation layer, a second portion disposed on the first portion of the third insulating dam and comprising the same material as the third insulation layer, and a third portion disposed on the second portion of the third insulating dam and comprising the same material as the pixel defining layer.

17. The display apparatus of claim 1, wherein the second layer of the first power source line comprises an extended portion protruding along the first insulating dam in a plan view.

18. The display apparatus of claim 17, further comprising:
a second power source line disposed in the peripheral area, the second power source line comprising a first layer disposed between the substrate and the first insulation layer, and a second layer disposed between the first layer of the second power source line and the first insulation layer and electrically connected to the first layer of the second power source line.

19. The display apparatus of claim 18, wherein a distance between the extended portion of the second layer of the first power source line and the second layer of the second power source line is less than a distance between a portion of the second layer of the first power source line where the extended portion is not formed and the second layer of the second power source line in a plan view.

20. The display apparatus of claim 1, further comprising:
a first inorganic layer disposed on the substrate and covering the second layer of the first power source line and the first insulating dam;
an organic layer disposed on the first inorganic layer and not overlapping an upper surface of the first insulating dam; and
a second inorganic layer disposed on the organic layer and the first inorganic layer.

* * * * *